United States Patent
Wu et al.

(10) Patent No.: US 6,445,007 B1
(45) Date of Patent: Sep. 3, 2002

(54) LIGHT EMITTING DIODES WITH SPREADING AND IMPROVING LIGHT EMITTING AREA

(75) Inventors: Bor-Jen Wu, Taipei; Nae-Guann Yih, Tao-Yuan; Chien-An Chen, Hsin-Chuang; Nai-Chuan Chen, Pan-Chiao, all of (TW)

(73) Assignee: Uni Light Technology Inc., Tao-Yuan (TW)

( * ) Notice: Subject to any disclaimer, the term of this patent is extended or adjusted under 35 U.S.C. 154(b) by 0 days.

(21) Appl. No.: 09/811,688

(22) Filed: Mar. 19, 2001

(51) Int. Cl.⁷ ............................................... H01L 27/15
(52) U.S. Cl. ............................. 257/80; 257/90; 257/91; 257/95; 257/98
(58) Field of Search .............................. 257/76, 77, 91, 257/95, 97, 98, 99, 100, 101, 103

(56) References Cited

U.S. PATENT DOCUMENTS 5,416,342 A * 5/1995 Edmond et al. ............... 257/76
5,861,636 A * 1/1999 Dutta et al. ................... 257/91
6,307,218 B1 * 11/2001 Steigerwald et al. .......... 257/99

* cited by examiner

Primary Examiner—David Nelms
Assistant Examiner—Mai-Huong Tran
(74) Attorney, Agent, or Firm—Powell Goldstein Frazer & Murphy LLP

(57) ABSTRACT

The present invention provides a light semiconductor device comprising a substrate and a first semiconductor structure on the substrate. A light emitting structure is on a first portion of the first semiconductor structure. A first contact structure is on a second portion of the first semiconductor structure. The second portion is separated from the first portion of the first semiconductor structure. The first contact structure has a first shape. A second semiconductor structure is on the light emitting structure. A transparent contact is on the second semiconductor structure and has a cut-off portion to expose the portion of the second semiconductor structure and a second shape. A second contact structure is on the cut-off portion of the transparent contact. The second contact structure contacting the second semiconductor has a third shape. The second contact structure with the third shape corresponds to both the transparent contact with the second shape and the first contact structure with the first shape whereby a relationship provides a plurality of current paths with substantially equal distances between the first contact structure and the second contact structure.

47 Claims, 5 Drawing Sheets

LIGHT EMITTING DIODES WITH SPREADING AND IMPROVING LIGHT EMITTING AREA

BACKGROUND OF THE INVENTION

1. Field of the Invention

The invention relates to light emitting diodes, and more particularly to light emitting diodes with spreading current and improving light emitting area.

2. Description of the Prior Art

For the photonic semiconductor device, the light emitting diode (LED) may be the most commonly recognized device because of its application to such a wide variety of products and applications such as scientific equipment, medical equipment and, perhaps most commonly, various consumer products in which LEDs form the light source for various signals, indicators, gauges, clocks, and many other familiar items. Semiconductor sources such as LEDs are particularly desirable as light output devices in such items because of their generally long life, low power requirement, and high reliability.

Since early 1970s, gallium nitride (GaN)-based material has attracted attentions in applications to light emitters because of its wide bandgap nature. On the other hand, insulating and lattice mismatched substrate, such as sapphire (aluminum oxide, $Al_2O_c$) with its thermal stability, and optical transparency, has been widely used for the application to Group III nitrides because there is not any substrate having matched lattice. In U.S. Pat. No. 4,153,905, the planner GaN-based LED structure grown on the sapphire substrate with both n-type and p-type layers with corresponding ohmic contacts is proposed. However, it is still difficult to prepare a highly conductive p-type GaN layer. Therefore, it is more difficult to make p-type ohmic contacts on and spread current in the p-type GaN layer.

Recently, both Akasaki et al. and Nakamura et al. have implemented the methods to improve conductivity of p-type GaN layers. However, the conductivity of the p-type GaN is still inferior to that of the n-type one. Consequently, the p-type GaN layer is the topmost layer of the GaN-based LED structure, while a transparent contact on the p-type layer becomes indispensable for the better performance of a device. For the most utility of the light emitting surface, the n-type and p-type contacts have been placed as wide apart as possible, i.e. at the opposite corners of a device.

FIG. 1 is a plan view of a semiconductor light-emitting device having a GaN-based substrate according to the prior art. A cut-off portion 117 is provided in a p-type transparent electrode 115, exposing a portion of the surface of a p-type transparent electrode 115, exposing a portion of the surface of a p-type semiconductor layer 113. A bonding pad 116 strongly adheres to the p-type semiconductor layer 113 through the cut-off portion 117, and is electrically connected with the p-type transparent electrode 115. The cut-off portion 117, and hence the bonding pad 116, are arranged farthest from the n-electrode 114 provided on an n-type semiconductor layer 112. But the arrangement for the contacts has the disadvantage of current crowding occurring between these electrodes. As a result, the light emitting surface is not utilized efficiently, and the lifetimes of the transparent contact and the device are shortened by the current crowding.

SUMMARY OF THE INVENTION

One of the objectives of the present invention is to provide light emitting diodes with spreading current and improving light emitting area. A multitude of hollow patterns opened on the transparent contact can block the current shortcuts and further spread current and enhance the light emitting area.

Another one of the objectives of the present invention is to provide light emitting diodes with reducing density of the surface state and leakage current. A passivation layer covering over the surface can reduce the density of the surface state and lower leakage current.

Another one of the objectives of the present invention is to provide light emitting diodes that avoid current crowding. The designed shapes of contacts and position arrangement for contacts can provide the current paths with substantially equal distance between contacts.

The present invention provides a light semiconductor device comprising a substrate and a first semiconductor structure on the substrate. A light emitting structure is on a first portion of the first semiconductor structure. A first contact structure is on a second portion of the first semiconductor structure. The second portion is separated from the first portion of the first semiconductor structure. The first contact structure has a first shape. A second semiconductor structure is on the light emitting structure. A transparent contact is on the second semiconductor structure and has a cut-off portion to expose the portion of the second semiconductor structure and a second shape. A second contact structure is on the cut-off portion of the transparent contact. The second contact structure contacting the second semiconductor has a third shape. The second contact structure with the third shape corresponds to both the transparent contact with the second shape and the first contact structure with the first shape whereby a relationship provides a plurality of current paths with substantially equal distances between the first contact structure and the second contact structure.

BRIEF DESCRIPTION OF THE DRAWINGS

A better understanding of the invention may be derived by reading the following detailed description with reference to the accompanying drawing wherein.

DESCRIPTION OF THE PREFERRED EMBODIMENT

The semiconductor devices of the present invention are applicable to a board range of semiconductor devices and can be fabricated from a variety of semiconductor materials. While the invention is described in terms of a single preferred embodiment, those skilled in the art will recognize that many steps described below can be altered without departing from the spirit and scope of the invention.

Furthermore, there is shown a representative portion of a semiconductor structure of the present invention in enlarged cross-sections of the two dimensional views at several stages of fabrication. The drawings are not necessarily to scale, as the thickness of the various layers are shown for clarity of illustration and should not be interpreted in a limiting sense. Accordingly, these regions will have dimensions, including length, width and depth, when fabricated in an actual device.

In a preferred embodiment, the GaN-based device is used for demonstration. However, it should not be limited to such material system. The term "GaN-based materials" means the materials made of $Al_XGa_YIn_{(1-X-Y)}N$ where both X and Y is between 0 and 1 ($0 \leq X \leq 1$, $0 \leq Y \leq 1$) A GaN-based LED means the LED with a narrower bandgap GaN-based light-emitting structure sandwiched between single or multiple layers of a wider bandgap GaN-based structures with different conductive types on different sides of the light-emitting structure.

Moreover, the invention is applicable to LED grown on a non-conductive substrate, such as sapphire. It also can be applied to the LED on a conductive substrate, such as GaAs, GaP, Si, SiC, when a vertical conduction configuration is not available.

The present invention addresses methods of improving current spreading by means of device geometry and contact design. In the illustrated embodiment, a transparent ohmic contact layer is used on the top of the side of the device with less conductivity. All the contacts are carefully designed to minimize the current crowding, maximize the light-emitting area, and hence improve the efficiency and lifetime of the LED. Details of the concept of the current invention can be illustrated follows, the description of which is for illustrative purposes and in not to be regarded as non-limiting.

Figure 1:
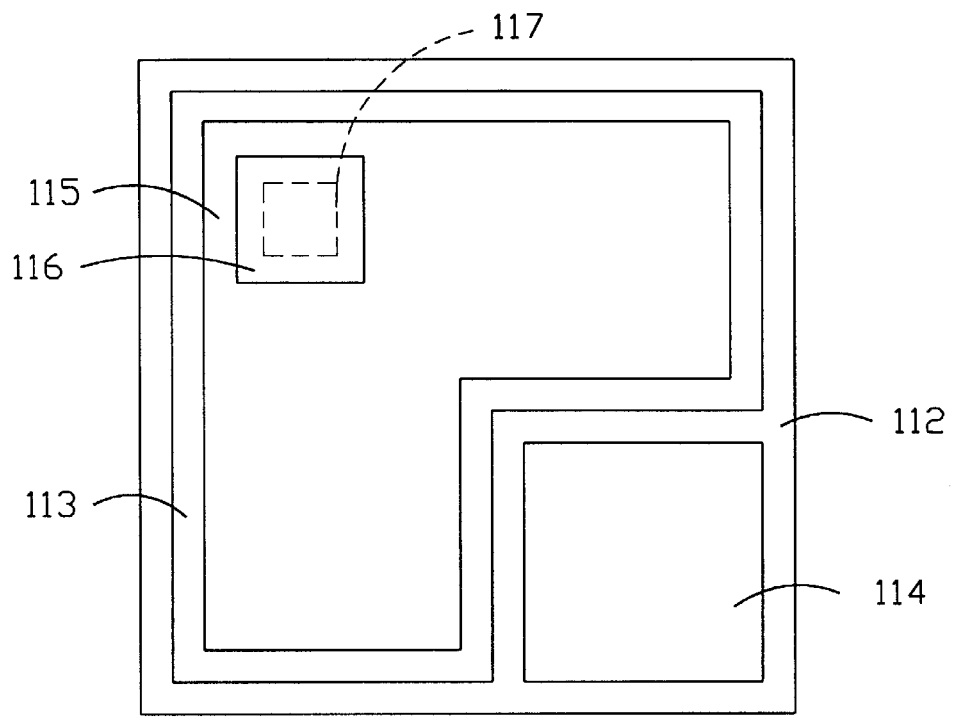
FIG. 1 is a diagram of plan view for a conventional GaN-based LED.
Figure 2:
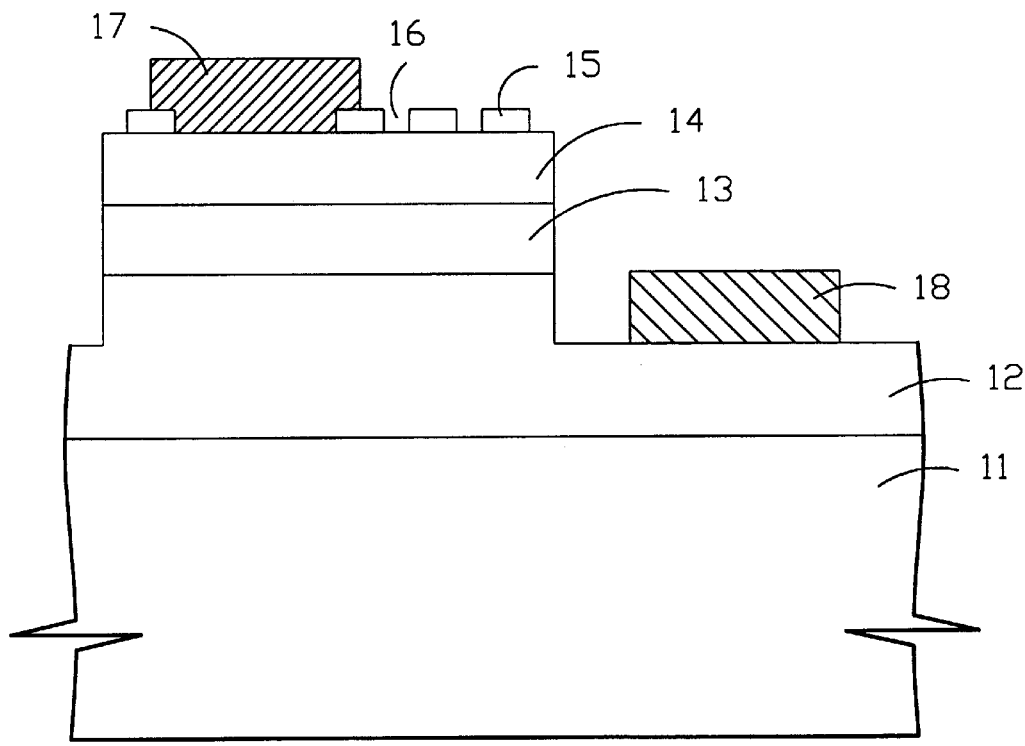
FIG. 2 is a cross-sectional schematic diagram illustrating a GaN-based LED grown on an insulating substrate having a contact structure with current blocking windows to improve current spreading in accordance with the present invention.
Figure 3:
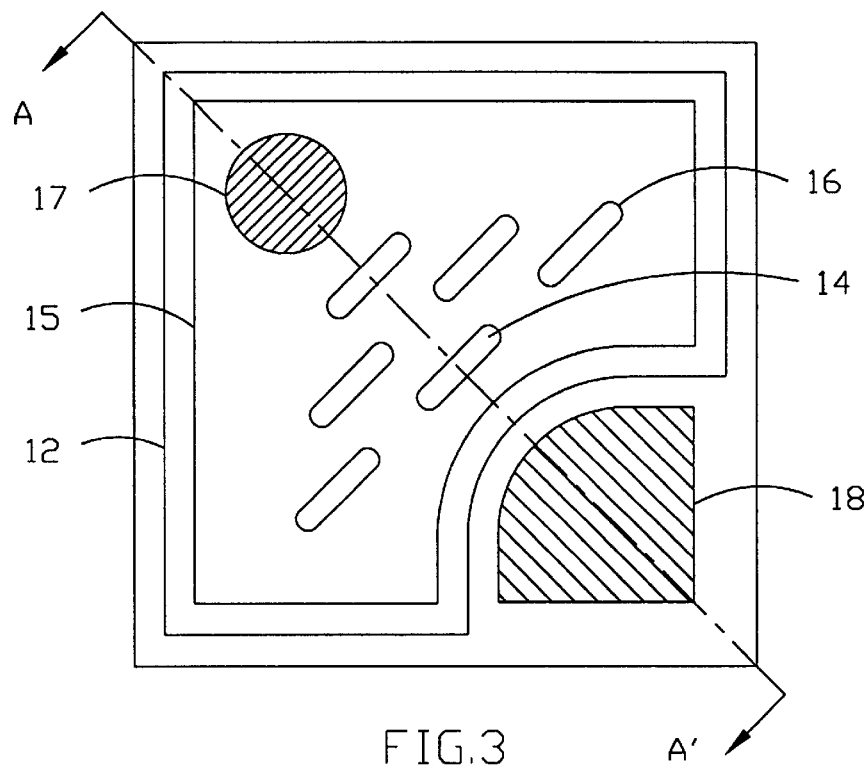
FIGS. 3 and 4 are diagrams of a plan view of the structure FIG. 2 taken along the line A—A in accordance with the present invention

Depicted in FIG. 2 and FIG. 3 is individually the cross-sectional and top-view diagrams illustrating the embodiment of the present invention. An n-type GaN structure 12 is grown on an insulating substrate 11, such as a sapphire substrate 11. A light emitting structure 13 is grown on the n-type GaN structure 12 followed by a p-type GaN structure 14 thereon. Both n-type GaN and p-type structures can be either a single layer, such as GaN, or multiple layers, such as a combination of GaN, AlN and other combinations. The light emitting structure can be a homogeneous p-n junction, a double hetero-junction, a single quantum well structure, or a multiple quantum well structure. The preferred device structure consists of a single n-type GaN layer, a InGaN/GaN multiple quantum well light emitting layer, and AlGaN/GaN (at p-side) layer grown on the sapphire substrate 11. The semiconductor LED is epitaxially prepared under the above arrangement.

Next, the epi-wafer is subject to a device processing, which includes defining a chip by mesa etching, metallization, and thermal processing. The metallization is implemented for a transparent contact 15 with a multitude of hollow patterns 16, p-type contact 17 (an electrode may be included), and n-type ohmic contact 18. Furthermore, the thermal process is implemented for the oxidation of the transparent ptype contact 17 and annealing of both p-type contact 17 and n-type ohmic contact 18. From the top-view, the p-type contact 17 and the n-type ohmic contact 18 are separated, that is, they are not overlapped at the vertical direction. The transparent contact 15 can be made by nickel oxide/Au, MgO, ZnO, and $V_2O_5$. In the embodiment, nickel oxide/Au is used for the transparent contact.

The designed hollow patterns (windows) 16 are the keys of the present invention, which may have many functions. First, the hollow patterns 16 can block current from taking a shortcut. Second, they can serve to even out differences between the shortest and the longest current paths if they are precisely designed. The transparent contact 15 is not totally transparent with 100% while the hollow patterns 16 act as optical paths with no thin metal blocking light from coupling out of the device. The emitting efficiency of the device is also improved via the patterns 16 (windows) at the same time with better current spreading.

Figure 4:
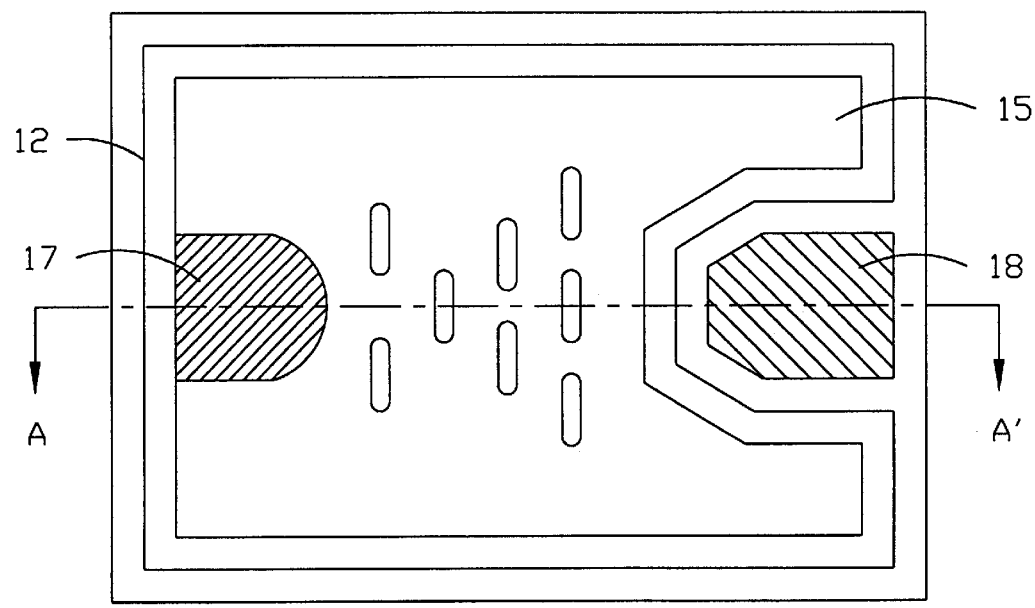

Furthermore, the shape, number, and position of the patterns 16 of the transparent contacts are not limited to those shown in the embodiment. It can and should be optimized to any different type of the current rating and the device applications. The present invention works most effectively when the p- and n-contacts are positioned at the opposite sides. FIG. 4, a top-view diagram depicts another example of the present invention applied to a rectangular shaped LED with the p-type contacts 17 and n-type ohmic contacts 18 positioned at the opposite sides of the rectangle.

Figure 5:
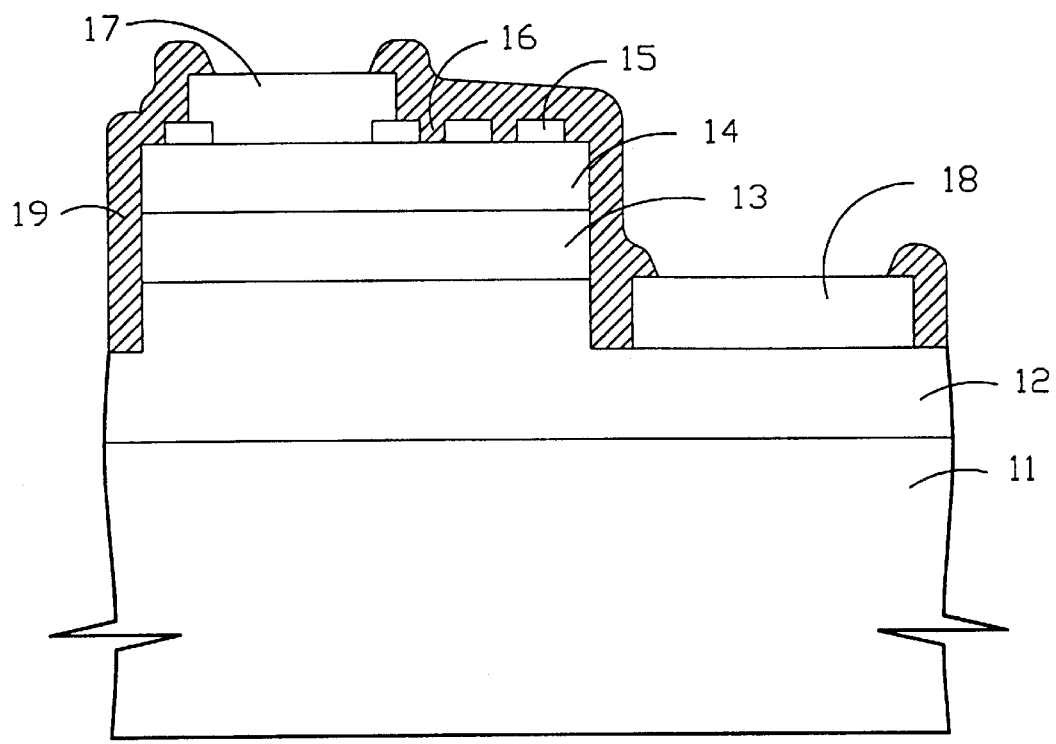
FIG. 5 is a cross-sectional diagram illustrating a passivation layer covering the surface of the LED for improving reliability of the device.

The performance of the device may be further improved by minimizing the number of the surface states, which is responsible for the leakage current. The surface states can be greatly reduced by applying a passivation layer 19 over the device, shown in FIG. 5. A multitude of materials can be implemented for the purpose of surface passivation. For a light emitter, the surface passivation layer has high optical transmission at the emitted wavelength and is electrically insulating or highly resistive. Those materials, such as aluminum oxide, silicon oxide, silicon nitride, tantalum oxide, titanium oxide, calcium fluoride, hafnium oxide, zinc sulfide and zinc oxide, may meet the requirement. The passivation layer also can be applied to any other embodiments of the present invention, and thus the arrangement will not be emphasized and mentioned repeatedly.

Figure 6:
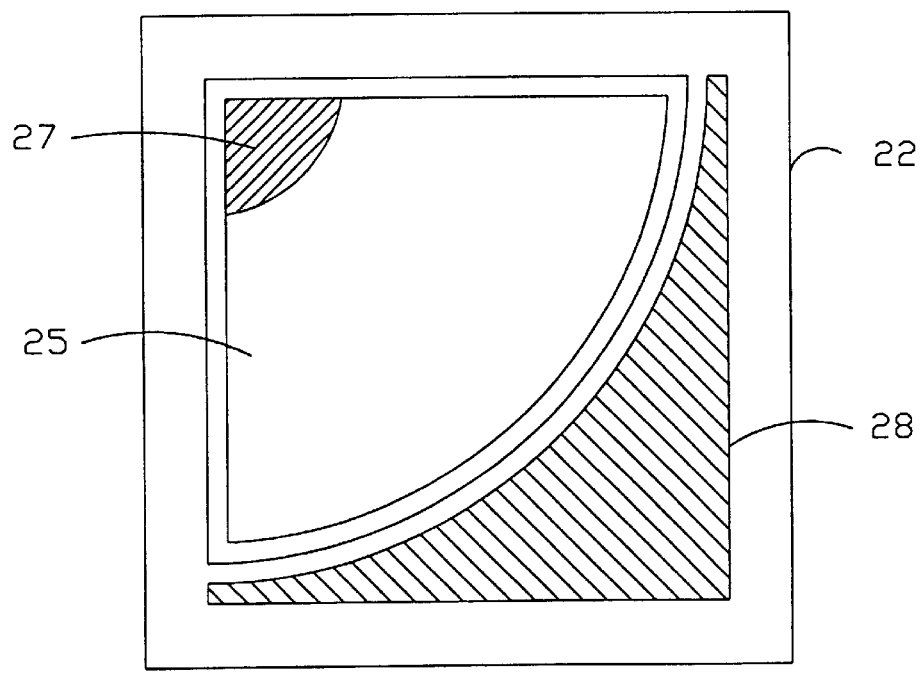
FIGS. 6 through 8 are multitude diagrams of top views illustrating the shapes and arrangements for the contacts in accordance with the present invention.

FIG. 2 to FIG. 4 are focused on the current blocking patterns that force the current to spread out more uniformly. Another geometric approach is used to spread the current uniformly. FIG. 6 is a top-view diagram illustrating the improvement of geometry in accordance with the present invention. The device structure has precisely designed mesa and contact structures so that the shortest distances between the contacts are kept the same. As mentioned above, the current in a conventional LED may get crowded between the contacts (or contact pads) because electrons tend to shortcut their paths, and a large portion of the chip is not efficiently used.

In the second embodiment, a transparent contact 25, a p-type contact 27, and an n-type contact 28 are on an n-GaN structure 22. They are arranged in such a way that the distance from any point of the p-type contact 27 to the n-type contact 28 is the shortest and kept the same for each path. The p-type contact 27 has a quarter-circle shape, and the transparent contact 25 has a fan shape that has a same center of the circle as that of the p-type contact 27. The radial distance of the spread current is all the same from the p-type contact 27 to the n-type contact 28 through the transparent contact 25.

Figure 7:
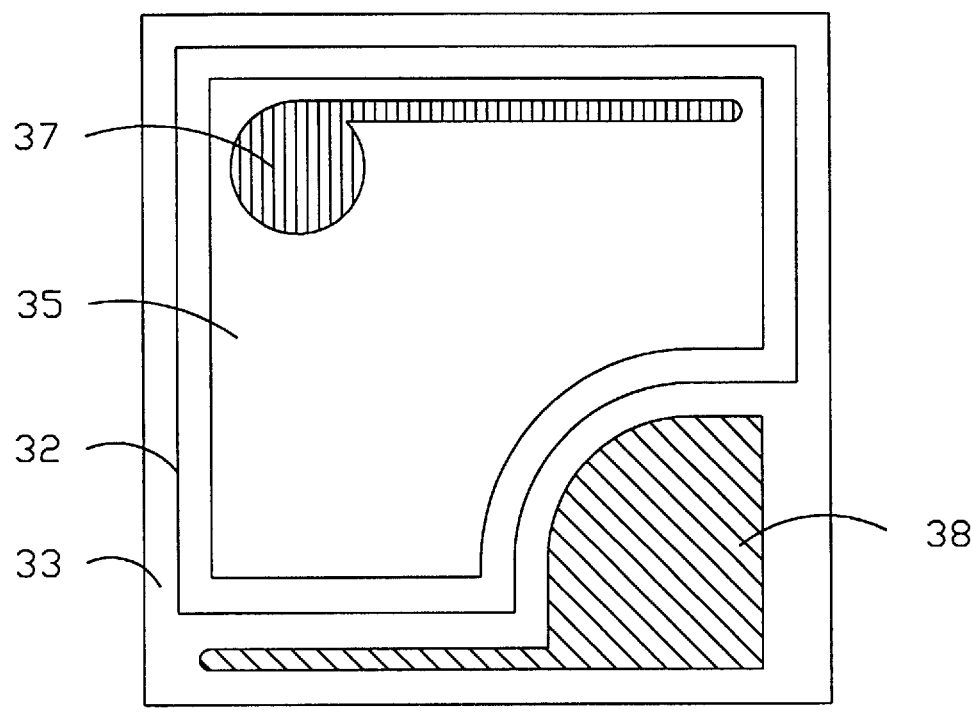

Depicted in FIG. 7 is another design of the shapes and arrangements for a p-type contact 37, an n-type contact 38, and a transparent contact 35 on a mesa structure 32 which is on an n-GaN structure 33. The p-type contact 37 and the n-type contact 38 are arranged at the opposite sides rather than the opposite corners. The shapes of the p-type contact 37 and the n-type contact 38 are spread in two dimensions. The shapes and arrangement also can build current paths with the same and uniform distance between the n-type and p-type contacts.

Figure 8:
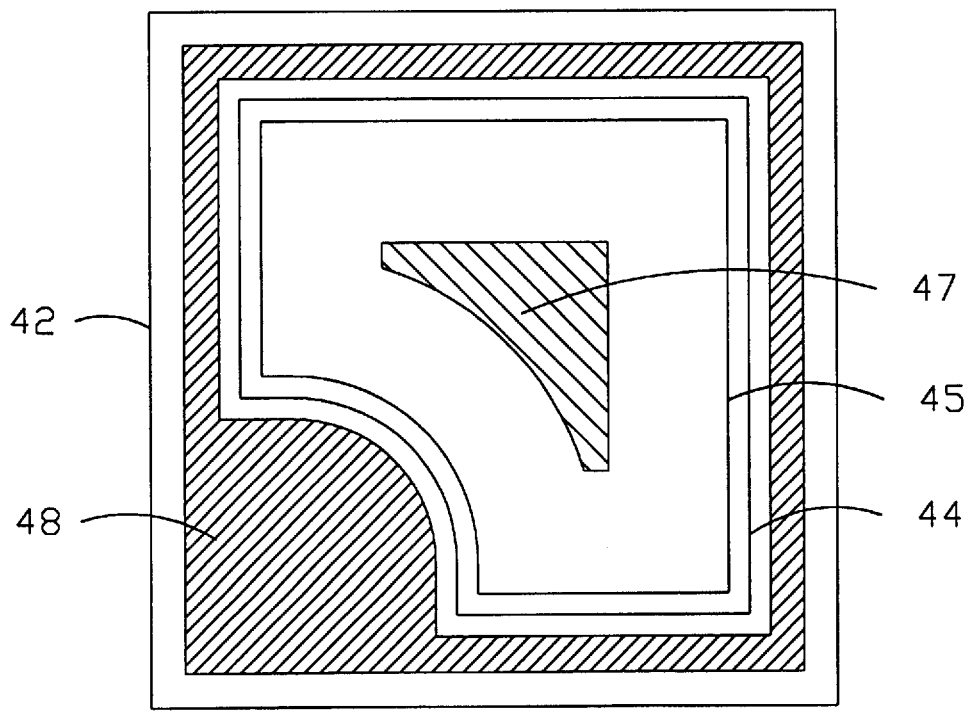

Again, the current spreading and efficient usage of the light-emitting area is further improved with more symmetrical contact configuration, shown in FIG. 8. In the illustrated embodiment, the epi-layer structure is the same as that of the first embodiment, while the shapes of the mesa and contacts are different. A ring-shaped n-type contact 48 is around the device and on the n-type GaN-based layer 42. Both are located at the bottom of the mesa. A p-type transparent contact 45 is on a p-type GaN-based layer 44 and the p-type GaN-based layer 44 is at the top of the mesa. For spreading the current, a p-type contact 47 is positioned at or near the center of the mesa, and n-type contact 48 has a contact pad and a conduction ring. The shapes and positions for both contacts (47 and 48) provide all current distances between the contacts equal or nearly equal all the way around the mesa. Therefore, the device exhibits current spreading and high area utility. The shape of the p-type contact 47 is not limited to the one shown in FIG. 8. For a small chip with the sizes of 14 mils or less, the shape of the contact may be simpler, such as circular, square with or without extended fingers, and so on. Such a design also can be applied to the following embodiment.

Figure 9:
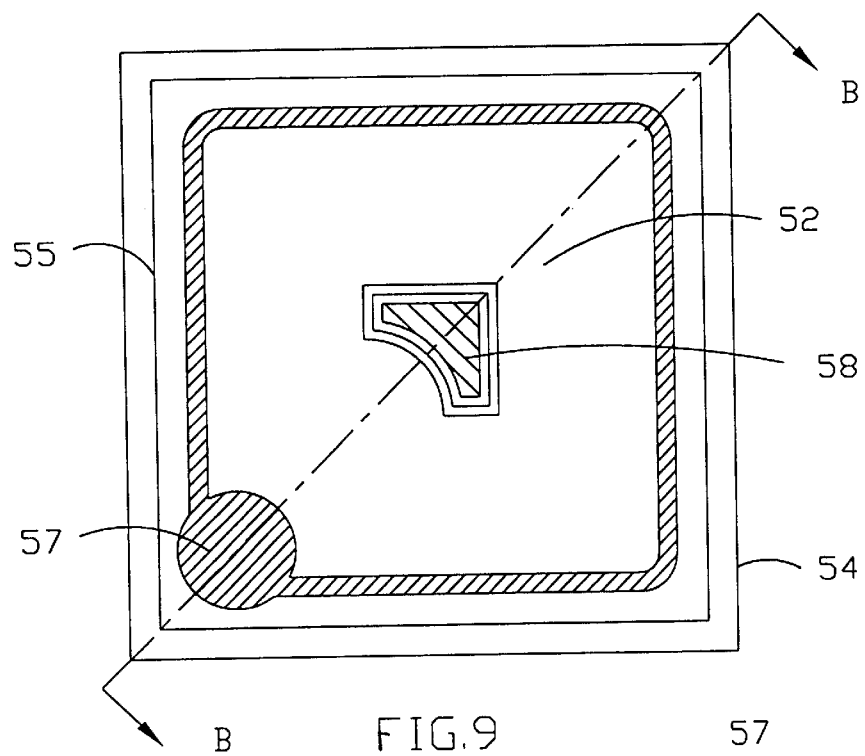
FIG. 9 is a diagram of a top view for another embodiment illustrating the n-type contact at a center of the LED in accordance with the present invention.
Figure 10:
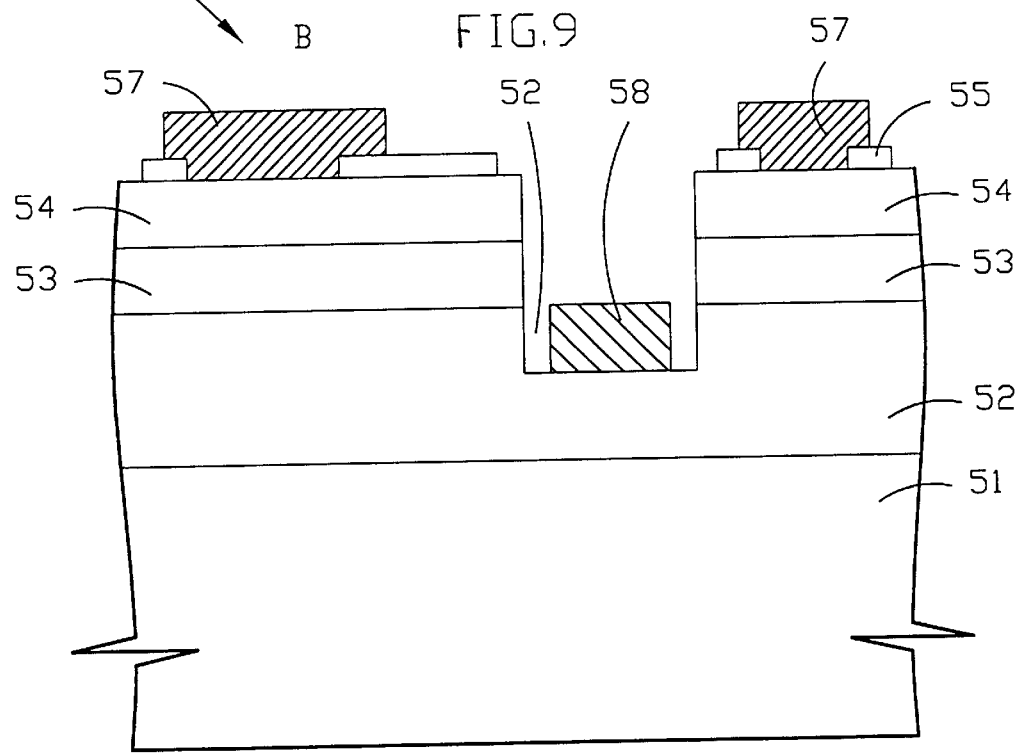
FIG. 10 is a cross-sectional diagram of FIG. 9.

Illustrated next is another embodiment, a top-view diagram shown in FIG. 9 and a cross-sectional one in FIG. 10. For good conductivity and carrier mobility of n-type materials, the current spreading capability of the n-type layer is utilized. An n-type contact 58 is arranged at or near the center of the device with an inverted mesa (or well) structure. A p-type transparent contact 55 covers almost all the rest area of the device, thus may maximize the efficient light-emitting area. The current spreading is enhanced by a ring-shape p-type contact 57. In the preferred embodiment, the area of the p-type transparent contact 55 is larger than one of the p-type transparent contact 45 of FIG. 8, thus a larger valuable light-emitting area is provided. Those epi-layers consisting of an n-type structure 52, light-emitting structure 53 and a p-type structure 54 are implemented using the same materials as the ones in FIG. 2. The materials of the contacts, such as a transparent contact 55, an n-type contact 58, and a p-type contact 57 are the same as the ones in FIG. 2. According to this designed structure, the current is well spread with a low contact resistance, and the lifetime of the transparent contact is prolonged.

The present invention provides a light emitting diode device comprising a substrate and a first semiconductor structure on the substrate. A light emitting structure is on a first portion of the first semiconductor structure. A first contact structure is on a second portion of the first semiconductor structure. The second portion is separated from the first portion of the first semiconductor structure. The first contact structure has a first shape. A second semiconductor structure is on the light emitting structure. A transparent contact is on the second semiconductor structure and has a cut-off portion to expose the portion of the second semiconductor structure and a second shape. A second contact structure is on the cut-off portion of the transparent contact. The second contact structure contacting the second semiconductor has a third shape. The second contact structure with the third shape corresponds to both the transparent contact with the second shape and the first contact structure with the first shape whereby a relationship provides a plurality of current paths with substantially equal distances between the first contact structure and the second contact structure.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A light semiconductor device comprising:
    a substrate;
    a first semiconductor structure on said substrate, said first semiconductor structure consisted of a first portion and a second portion;
    a light emitting structure on said first portion;
    a first contact structure on said second portion, said first contact structure having a first shape;
    a second semiconductor structure on said light emitting structure;
    a transparent contact on said second semiconductor structure, said transparent contact having a plurality of hollow patterns enabled to light emitted therethrough, said transparent contact having a second shape; and
    a second contact structure on said transparent contact and electrically connected to said first contact structure, wherein said second contact structure with a third shape associated with said transparent contact with said second shape and said first contact structure with said first shape provides a plurality of current paths with substantially equal distances between said first contact structure and said second contact structure.

2. The device according to claim 1, wherein said plurality of hollow patterns are further used for turning directions of said current paths.

3. The device according to claim 1, wherein said first shape comprises a first arc-shape edge.

4. The device according to claim 3, wherein said second shape comprises a second arc-shape edge, and any point on said second arc-shape edge has substantially equal distance to said first arc-shape edge.

5. The device according to claim 3, wherein said third shape comprises a third arc-shape edge, and any point on said third arc-shape edge has substantially equal distance to said first arc-shape edge.

6. The device according to claim 1, wherein said first shape comprises a ring shape whereby said transparent contact is enclosed in by said first shape of said first contact structure.

7. The device according to claim 6, wherein said second contact structure is at center of said transparent contact, thus provides said current paths with substantially equal distance from said second contact structure to ring-shape first contact structure.

8. The device according to claim 1, wherein said third shape comprises a ring shape whereby said ring-shape second contact structure is in interior of said transparent contact.

9. The device according to claim 8, wherein said first contact structure has a position underlay near center of said ring-shape second contact structure whereby said current paths have substantially equal distances.

10. The device according to claim 1, wherein said first shape comprises having a first line shape and said first line-shape first contact structure is positioned at a first side of said transparent contact.

11. The device according to claim 10, wherein said third shape comprises a second line shape and said second line-shape is positioned at a second side opposite to said first side of said transparent contact, whereby said current paths have substantially equal distances.

12. The device according to claim 1, wherein said first contact structure and said second contact structure have opposite conductivity.

13. The device according to claim 1, wherein said first semiconductor structure and said first contact structure have same conductivity.

14. The device according to claim 1, wherein said second semiconductor structure and said second contact structure have same conductivity.

15. The device according to claim 1, wherein material of said substrate comprises sapphire.

16. The device according to claim 1, wherein material of said substrate comprises a conductive material under a normal operated condition of conduction blocking in the vertical direction.

17. The device according to claim 1, wherein said first and second semiconductor structures comprise compositions of $Al_XGa_YIn_{(1-X-Y)}N$-based epitaxyl layer where both X and Y have values between 0 and 1, individually.

18. The device according to claim 1, wherein said first and second semiconductor structures comprise an individual single layer structure.

19. The device according to claim 1, wherein said first and second semiconductor structure comprises a multi-layer structure.

20. The device according to claim 1, wherein said transparent contact comprises a nickel oxide/gold layer.

21. The device according to claim 1, wherein said first and second contact structures comprise an individual contact layer and an individual electrode.

22. The device according to claim 1, wherein said light emitting structure is selected from groups consisting of homogenous junction, double hetero-junction, single quantum well structure, and multi quantum well structure.

23. The device according to claim 1 further comprising a passivation layer covering on said transparent contact and at a plurality of side walls of said first contact structure and said second contact structure.

24. The device according to claim 23, wherein said passivation layer is selected form groups consisting of aluminum oxide, silicon oxide, silicon nitride, tantalum oxide, titanium oxide, calcium fluoride, hafnium oxide, zinc sulfide and zinc oxide.

25. A light emitting diode device comprising:
a substrate;
a first semiconductor structure on said substrate, said first semiconductor structure having a first conductivity, and consisted of a first portion and a second portion;
a light emitting structure on said first portion;
a first contact structure with said first conductivity on said second portion, said first contact structure having a first shape;
a second semiconductor structure on said light emitting structure, said second semiconductor having a second conductivity opposite to said first conductivity;
a transparent contact on said second semiconductor structure, said transparent contact having a plurality of hollow patterns enabled to light emitted therethrough, said transparent contact having a second shape; and
a second contact structure with said second conductivity on said transparent contact and electrically connected to said first contact structure, wherein said second contact structure with a third shape associated with said transparent contact with said second shape and said first contact structure with said first shape provides a plurality of current paths with substantially equal distances between said first contact structure and said second contact structure.

26. The device according to claim 25, wherein said plurality of hollow patterns are further used for turning directions of said current paths.

27. The device according to claim 25, wherein said first shape comprises a first arc-shape edge.

28. The device according to claim 27, wherein said second shape comprises a second arc-shape edge, and any point on said second arc-shape edge has a substantially equal distance to said first arc-shape edge.

29. The device according to claim 27, wherein said third shape comprises a third arc-shape edge, and any point on said third arc-shape edge has a substantially equal distance to said first arc-shaped edge.

30. The device according to claim 25, wherein said first shape comprises a ring shape whereby said transparent contact is enclosed in by said first shape of said first contact structure.

31. The device according to claim 25, wherein said second contact structure is at center of said transparent contact, thus provides said current paths with substantially equal distance from said second contact structure to ring-shape first contact structure.

32. The device according to claim 25, wherein said third shape comprises a ring shape whereby said ring-shape second contact structure is in interior of said transparent contact.

33. The device according to claim 32, wherein said first contact structure has a position underlay near center of said ring-shape second contact structure whereby said current paths have substantially equal distances.

34. The device according to claim 25, wherein said first shape comprises a first line shape and said first line-shape first contact structure is positioned at a first side of said transparent contact.

35. The device according to claim 34, wherein said third shape comprises a second line shape and said second line-shape is positioned at a second side opposite to said first side of said transparent contact, whereby said current paths have substantially equal distances.

36. The device according to claim 25, wherein material of said substrate comprises sapphire.

37. The device according to claim 25, wherein material of said substrate comprises a conductive material under a normal operated condition of conduction blocking in the vertical direction.

38. The device according to claim 25, wherein said first and second semiconductor structures comprise compositions of $Al_XGa_YIn_{(1-X-Y)}N$-based epitaxyl layer where both X and Y have values between 0 and 1, individually.

39. The device according to claim 25, wherein said first and second semiconductor structures comprise an individual single layer structure.

40. The device according to claim 25, wherein said first and second semiconductor structure comprises a multi-layer structure.

41. The device according to claim 25, wherein said transparent contact comprises a nickel oxide/gold layer.

42. The device according to claim 25, wherein said first and second contact structures comprise an individual contact layer and an individual electrode.

43. The device according to claim 25, wherein said light emitting structure is selected from groups consisting of homogenous junction, double hetero-junction, single quantum well structure, and multi quantum well structure.

44. The device according to claim 25 further comprising a passivation layer covering on said transparent contact and at a plurality of side walls of said first contact structure and said second contact structure.

45. The device according to claim 44, wherein said passivation layer is selected from groups consisting of aluminum oxide, silicon oxide, silicon nitride, tantalum oxide, titanium oxide, calcium fluoride, hafnium oxide, zinc sulfide and zinc oxide.

46. A light emitting diode device comprising:

a substrate;

a first semiconductor structure of n-type on said substrate, said first semiconductor structure consisted of a first portion and a second portion surrounded by said first portion;

a light emitting structure on said first portion;

a first contact structure of n-type on said second portion, said first contact structure having a first shape;

a second semiconductor structure of p-type on said light emitting structure;

a transparent contact on said second semiconductor structure, said transparent contact having a plurality of hollow patterns enabled to light emitted therethrough, said transparent contact having a second shape; and a second contact structure of p-type on said transparent contact and electrically connected to said first contact structure, wherein said second contact structure with a third shape associated with said transparent contact with said second shape and said first contact structure with said first shape provides a plurality of current paths with substantially equal distances between said first contact structure and said second contact structure.

47. The device according to claim 46, wherein said hollow patterns are further used for turning directions of said current paths.

* * * * *